United States Patent
Ni et al.

(10) Patent No.: US 7,609,523 B1
(45) Date of Patent: *Oct. 27, 2009

(54) MEMORY MODULE ASSEMBLY INCLUDING HEAT SINK ATTACHED TO INTEGRATED CIRCUITS BY ADHESIVE AND CLIPS

(75) Inventors: Jim Ni, San Jose, CA (US); Abraham C. Ma, Fremont, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 245 days.

This patent is subject to a terminal disclaimer.

(21) Appl. No.: 11/691,452

(22) Filed: Mar. 26, 2007

Related U.S. Application Data

(63) Continuation-in-part of application No. 10/956,893, filed on Sep. 29, 2004, now Pat. No. 7,215,551.

(51) Int. Cl.
*H05K 7/20* (2006.01)
*H01L 23/36* (2006.01)

(52) U.S. Cl. .............. 361/715; 361/720; 361/710; 361/709; 361/711; 257/707

(58) Field of Classification Search ........... 361/702, 361/707, 709–711, 715, 720; 257/707
See application file for complete search history.

(56) References Cited

U.S. PATENT DOCUMENTS

| | | | |
|---|---|---|---|
| 4,606,962 A | 8/1986 | Reylek et al. | |
| 5,109,318 A | 4/1992 | Funari et al. | |
| 5,313,097 A | 5/1994 | Haj-Ali-Ahmadi et al. | |
| 5,475,563 A | 12/1995 | Donahoe et al. | |
| 5,661,339 A | 8/1997 | Clayton | |
| 5,710,693 A * | 1/1998 | Tsukada et al. | 361/679.32 |
| 5,731,633 A | 3/1998 | Clayton | |
| 5,751,553 A | 5/1998 | Clayton | |
| 5,793,609 A | 8/1998 | Donahoe et al. | |
| 5,892,660 A | 4/1999 | Farnworth et al. | |
| 5,896,274 A * | 4/1999 | Ishida | 361/737 |
| 6,049,975 A | 4/2000 | Clayton | |
| 6,091,145 A | 7/2000 | Clayton | |
| 6,232,659 B1 | 5/2001 | Clayton | |
| 6,353,538 B1 | 3/2002 | Ali et al. | |
| 6,362,965 B2 | 3/2002 | Bookhardt et al. | |
| 6,362,966 B1 | 3/2002 | Ali et al. | |

(Continued)

FOREIGN PATENT DOCUMENTS

JP  2000251463 A  9/2000

(Continued)

*Primary Examiner*—Anatoly Vortman
(74) *Attorney, Agent, or Firm*—Bever, Hoffman & Harms, LLP; Patrick T. Bever

(57) ABSTRACT

A memory module assembly includes two-plate heat sink attached to one or more of the integrated circuits (e.g., memory devices) of a memory module PCBA by adhesive. The adhesive is either heat-activated or heat-cured. The adhesive is applied to either the memory devices or the heat-sink plates, and then compressed between the heat-sink plates and memory module using a fixture. The fixture is then passed through an oven to activate/cure the adhesive. The two heat sink plates are then secured by a clip to form a rigid frame.

16 Claims, 10 Drawing Sheets

U.S. PATENT DOCUMENTS

| | | |
|---|---|---|
| 6,377,460 B1 | 4/2002 | Pohl et al. |
| 6,424,532 B2 | 7/2002 | Kawamura |
| 6,449,156 B1 | 9/2002 | Han et al. |
| 6,661,661 B2 | 12/2003 | Gaynes et al. |
| 6,781,848 B2 | 8/2004 | Farnworth et al. |
| 7,023,700 B2 | 4/2006 | Chiou et al. |
| 7,079,396 B2 | 7/2006 | Gates et al. |
| 7,106,595 B2 | 9/2006 | Foster, Sr. et al. |
| 2002/0001180 A1 | 1/2002 | Kawamura |
| 2002/0079117 A1 | 6/2002 | Coffin et al. |
| 2003/0026076 A1 | 2/2003 | Wei |
| 2003/0193788 A1 | 10/2003 | Farnworth et al. |
| 2005/0276021 A1 | 12/2005 | Gates et al. |
| 2006/0056154 A1 | 3/2006 | Foster et al. |
| 2007/0274032 A1 * | 11/2007 | Ni et al. .................. 361/684 |

FOREIGN PATENT DOCUMENTS

| | | |
|---|---|---|
| KR | 336757 B | 5/2002 |
| KR | 2002045747 A | 6/2002 |

* cited by examiner

MEMORY MODULE ASSEMBLY INCLUDING HEAT SINK ATTACHED TO INTEGRATED CIRCUITS BY ADHESIVE AND CLIPS

CROSS-REFERENCE TO RELATED APPLICATIONS

The present application is a continuation-in-part of co-owned and co-pending U.S. application Ser. No. 10/956,893, filed Sep. 29, 2004, entitled "MEMORY MODULE ASSEMBLY INCLUDING HEAT SINK ATTACHED TO INTEGRATED CIRCUITS BY ADHESIVE", which is incorporated herein by reference in its entirety.

FIELD OF THE INVENTION

This invention relates to standardized memory modules for expanding the memory capacity of personal computers and other computing systems, and more particularly to memory module assemblies that include heat-sink structures.

BACKGROUND OF THE INVENTION

Heat sinks have been widely used to assist in cooling electronic components. Some microprocessors have heat sinks attached to allow for higher-frequency operation. Other components such as memory modules may also benefit from heat sinks.

Most personal computers (PC's) are shipped with sockets for memory modules so that their owners can later add additional modules, increasing the memory capacity of the PC. Other non-PC devices may also use memory modules designed for PC's. High-volume production and competition have driven module costs down dramatically, benefiting the buyer.

Memory modules are made in many different sizes and capacities, with the older 30-pin modules replaced by 72-pin, 168-pin, and other size modules. The "pins" were originally pins extending from the module's edge, but now most modules are lead-free, having metal contact pads, fingers, or leads. The modules are small in size, some being about 5.25 inches long and 1.2 or 1.7-inches high.

Conventional memory modules include a small printed-circuit board (PCB) substrate and several surface mounted components (e.g., memory devices) mounted on one or both surfaces of the PCB substrate. The PCB substrate is typically a multi-layer board with alternating laminated layers of fiberglass insulation and foil or metal interconnection layers. The contact pads (or other contact structures) are typically aligned along a bottom (connector) edge of the PCB substrate. The interconnect layers define wiring traces that provide signal paths between the surface mounted components and the contact pads. The surface mounted components (e.g., memory devices) are soldered or otherwise attached to one or both surfaces of the substrate, with each component typically including one or more integrated circuit (IC) "chips" that are packaged in inexpensive surface-mount packages such as small-outline J-leaded (SOJ) packages, plastic leaded chip carriers (PLCC's), thin small-outline packages (TSOP) or small-outline (SO) packages. The number of memory devices mounted on the PCB substrate of a memory module depends on the capacity and the data-width of the memory chips and the size of the memory module.

FIG. 15 is a diagram showing a memory module with dynamic-random-access memory (DRAM) devices. The memory module contains substrate 10, with surface-mounted DRAM devices 20 mounted directly to the front surface or side of substrate 10, while more DRAM devices (not visible) are usually mounted to the back side or surface of substrate 10. Metal contact pads 12 are positioned along the bottom or connector edge of the module on both front and back surfaces. When the memory module is mounted into a host system (e.g., a personal computer (PC)), metal contact pads 12 mate with pads on a module socket (not shown) to electrically connect the module to the host system's motherboard. Holes and/or notches 14, 16 are sometimes used to ensure that the module is correctly positioned in the socket. For example, notch 14 can be offset from the center of substrate 10 to ensure that the memory module cannot be inserted backwards in a socket. Notches 16 match with clamps of the module socket to ensure that the memory module is securely positioned in the socket.

As processor speeds have increased, the need for faster memory has become more critical. Various bandwidth-enhancing methods and memory interfaces have been used. Memory chips have higher densities and operate at higher frequencies than before, producing more waste heat from the memory chips. Thus, a need has arisen to remove this waste heat from memory modules.

Conventional memory module assemblies typically include three components: the memory module PCBA and two metal heat-sink plates that are coupled together using one or more fasteners, such as a metal clamp. The contact between PCBA and metal heat-sink plate is usually aided by sandwiching a tape of thermal interface material (TIM) in-between. Various heat-sink plates have been designed for producing such memory module assemblies. See for example U.S. Pat. Nos. 6,362,966, 6,424,532, and 6,449,156, among others. Clamp-on heat-sink plates for memory modules are also known. For example, OCZ Technology produces a copper heat sink with wider metal bands that clip the heat sink to over the front and back surfaces of the memory module. These clip-on and clamp-on designs increase the manufacturing costs and complexity of the associated memory modules because they are difficult to incorporate into automated production lines. Further, the use of clamps or similar structures facilitates easy disassembly by users, resulting in undesirable situations. Moreover, the presence of the clamps and thermal interface material increase the overall thickness of the memory module assembly, thereby taking up valuable motherboard space.

Some memory-module heat sinks feature a closed-top design that prevents airflow in the small gaps between the heat sink and the memory module substrate. Often the entire top edge of the heat sink is closed, providing no path for air to flow under the heat sink other than back out the bottom edge, which is usually open. Sides may be open or partially open, but the sides are much smaller than the top and bottom edges of the memory module, limiting the possible air-flow.

What is needed is a memory module assembly having a protective metal heat-sink plate (shield) mounted over the surface mounted IC devices of a memory module PCBA that both serves to protect the PCBA and to dissipate heat generated by the IC devices, and is easily and inexpensively produced using automated methods.

SUMMARY OF THE INVENTION

The present invention is directed to a memory module assembly including heat sink plates that are directly attached to one or more of the integrated circuits (IC) devices of a memory module printed circuit board assembly (PCBA) using an adhesive, whereby the heat-sink plates both protect the memory module PCBA and dissipate heat generated by the IC devices thereof. By directly attaching the heat-sink plates to the IC devices of the memory module PCBA, the present invention facilitates a simplified automated manufacturing method that greatly reduces overall production costs.

The memory module assembly of the present invention utilizes a memory module PCBA that is essentially identical to conventional memory modules, thus allowing the present invention to be utilized with existing electronics. That is, similar to conventional memory modules, the IC devices are surface mounted on both surfaces of a printed-circuit board (PCB) substrate. The PCB substrate includes metal contact pads arranged along a connector (bottom) edge, and multiple wiring traces that provide signal paths between the IC devices and the contact pads. An important aspect of the present invention is the IC devices are packaged and surface mounted on the PCB substrate such that an upper surface of each of these IC devices defines a plane that is substantially parallel to the planar PCB surface on which it is mounted, although the height of each IC device may vary. In particular, the planar upper surfaces of these IC devices are used to secure the memory module PCBA to planar underside surfaces of the heat sink plates by way of the adhesive.

According to an embodiment of the present invention, the adhesive is a heat-activated or heat-cured adhesive that is applied to either the upper surface of the one or more IC devices, or to the planar underside surfaces of the heat-sink plates. When applied, the adhesive is viscous and has a relatively low adhesion to facilitate manipulation of the cover and memory module PCBA until a desired orientation is achieved. The adhesive is then compressed between the heat-sink plate and IC devices, and is held in the compressed state using a fixture. The fixture is then passed through an oven maintained at a specified temperature (i.e., at or lower than the maximum safe operating temperature for the memory module components) to activate or cure the adhesive. In one embodiment, a heat-activated adhesive is used that exhibits a relatively low adherence prior to being heated to a high temperature (i.e., equal to or less than the maximum safe operating temperature of the memory module assembly), and the heat-activated adhesive exhibits a high adherence when subsequently cooled. In this case, subsequent removal of the heat-sink plates from the memory module PCBA requires reheating at a predetermined temperature to reflow the adhesive. In another embodiment, the heating process is used to "cure" a relatively highly thermally conductive adhesive, subsequent separation of the heat-sink plate requires the use of a chemical solvent to dissolve the heat-cured adhesive. In both cases, unauthorized tampering (i.e., removal of the heat-sink plates to access the IC devices) is rendered more difficult and easier to detect than conventional memory modules that utilize clips or fasteners. Further, the heat-cured adhesive is thin and thermally conductive to reduce thermal resistance between the IC devices and the heat-sink plates, thus facilitating a relatively high rate of heat flow from the IC devices to maintain relatively low operating temperatures. Thus, the use of heat-activated and/or heat-cured adhesive facilitates a greatly thinner memory module with heat sink and simplified assembly process whereby the heat-sink plates are secured to protect the memory module PCBA in a manner that reduces overall manufacturing costs, and prevents unauthorized tampering. In other embodiments, the adhesive maybe be a high thermal conductive adhesive film, a thermal-bond adhesive film, a thermal paste, or a combination or laminated structure thereof.

According to another aspect of the present invention, two heat-sink plates are attached to the memory module PCBA such that tabs formed on at least one of the two heat-sink plates extends into an alignment notch formed on a side edge of the PCBA, thereby facilitating reliable automatic alignment of the heat-sink plates to the PCBA during the assembly and heat-treating process. In one embodiment, a single tab extends from one heat-sink plate along the entire alignment notch, and is engaged into a receiving structure formed on the second heat-sink plate. In another embodiment, short tabs extend from both heat-sink plates into the alignment notch formed in the PCBA.

According to yet another aspect of the present invention, two heat-sink plates are further attached to the memory module PCBA by one or more single-piece clips to provide a more sturdy and reliable engagement arrangement. Each single-piece clip includes a first engaging portion connected to the first outer surface of a first heat-sink plate, a second engaging portion connected to the second outer surface of the opposing second heat-sink plate, and a linking member connected between the first and second engaging members that extends along a side edge of the PCBA. In one embodiment, two clips are respectively mounted on opposite sides of a centrally located Advanced Module Buffer (AMB) chip, and in other embodiments a single clip is mounted such that engagement portions of the clip are engaged to the heat-sink plate on opposite sides of the AMB chip. In one embodiment, outer surfaces of the heat-sink plates are fabricated to include holes and/or hooks that securely engage the engaging portions of the clips, and in another embodiment the engagement portions of the clips are inserted into slots formed in a raised central pocket formed in the heat-sink plate for housing the AMB chip.

DETAILED DESCRIPTION

The present invention relates to improvements in memory module assemblies (i.e., a memory module printed circuit board assembly (PCBA) and one or more heat-sink plates). The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figures 1A, 1B:
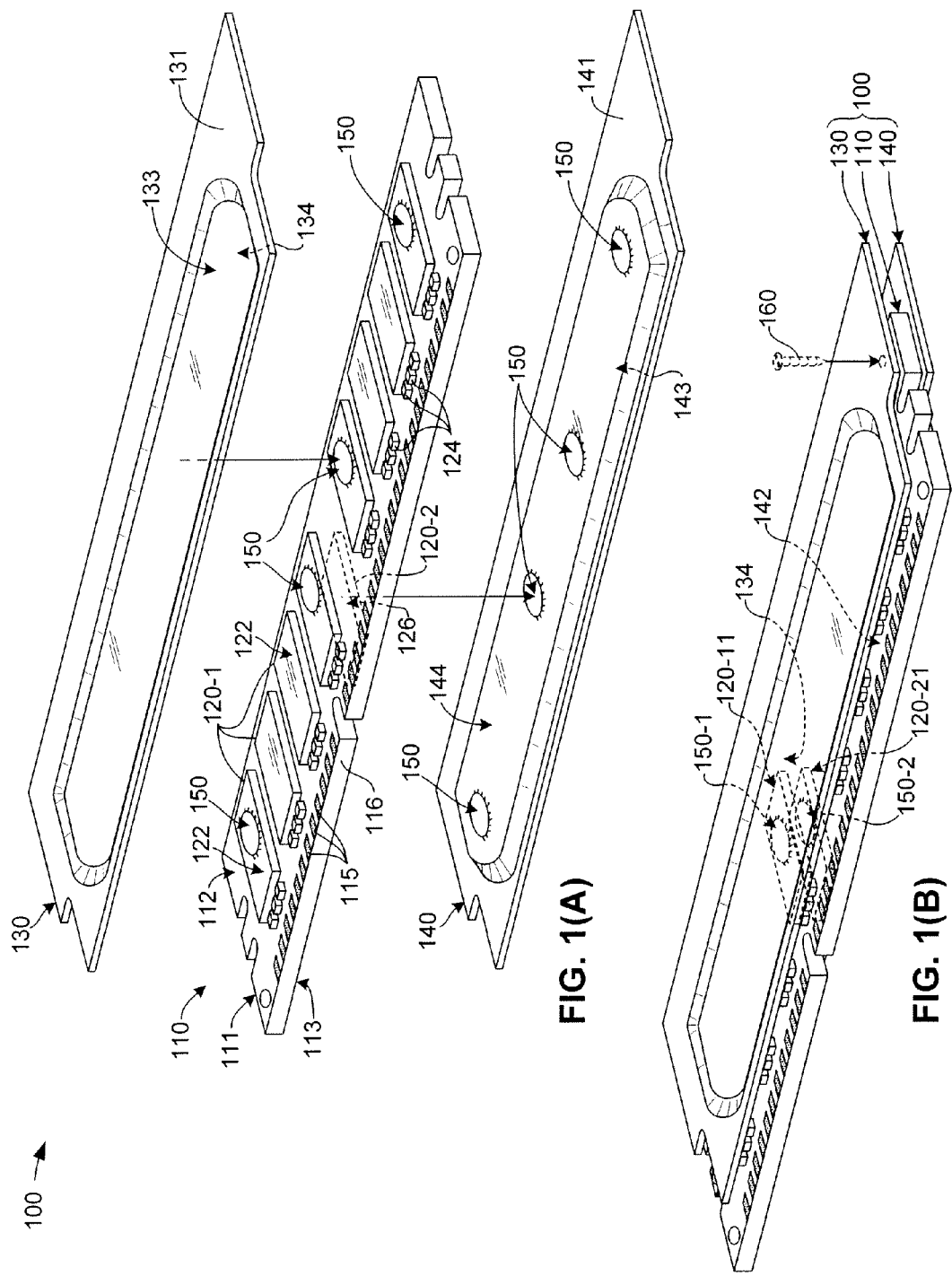
FIGS. 1(A) and 1(B) are an exploded perspective view and an assembled perspective view, respectively, showing a memory module assembly according to an embodiment of the present invention.
Figure 2:
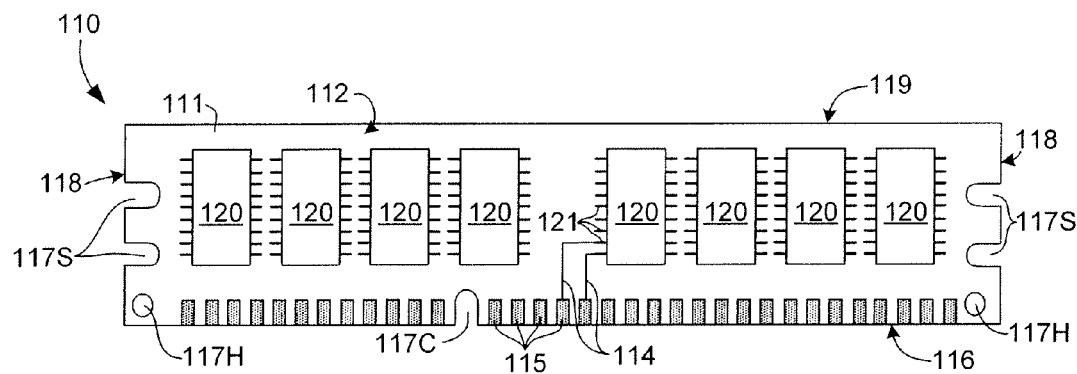
FIG. 2 is a top view showing a memory module PCBA of the memory module assembly shown in FIG. 1(A).
Figure 3:
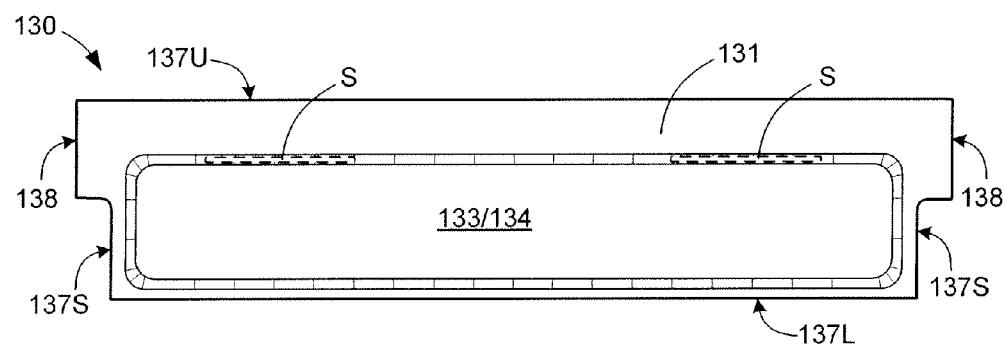
FIG. 3 is a top view showing a heat-sink plate of the memory module assembly shown in FIG. 1(A).
Figure 4A:
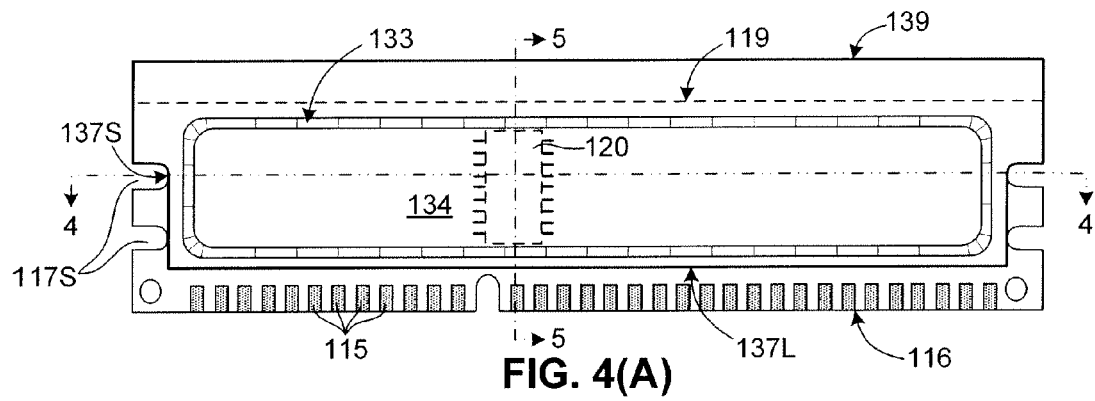
FIGS. 4(A) and 4(B) are top and cross-sectional side views showing the memory module assembly shown in FIG. 1(A).
Figure 4B:
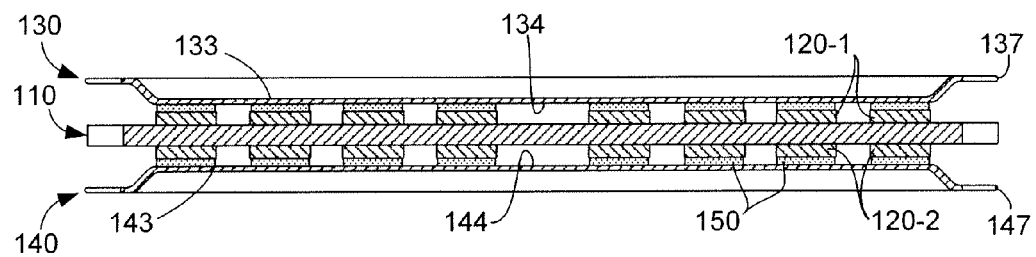
Figure 5:
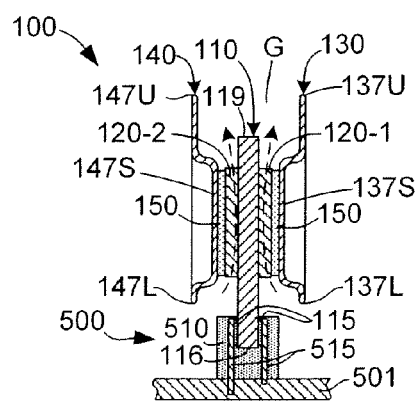
FIG. 5 is a cross-sectional end view showing the memory module assembly shown in FIG. 1(A).

FIGS. 1(A) to 5 show a memory module assembly 100 according to a simplified embodiment of the present invention. Memory module assembly 100 generally includes a memory module PCBA 110 and one or more heat-sink plates 130 and 140. FIGS. 1(A) and 1(B) are exploded perspective and assembled perspective views, respectively, showing the basic components of memory module assembly 100. FIG. 2 is a top view showing memory module PCBA 110 by itself, and FIG. 3 is a top plan view showing heat-sink plate 130 by itself. FIGS. 4(A) and 4(B) are top and cross-sectional side views, respectively, showing heat-sink plates 130 and 140 mounted on memory module PCBA 110. Finally, FIG. 5 is a cross-sectional end view taken along section line 5-5 of FIG. 4(A). Although the embodiment described below utilizes two heat-sink plates (i.e., plates 130 and 140) mounted onto opposite sides of memory module PCBA 110, unless otherwise specifically recited in the appended claims, only one heat-sink plate (i.e., plate 130 or plate 140) may be attached to only one side of memory module PCBA 110 in the manner described below.

Referring to FIGS. 1(A) and 2, memory module PCBA 110 includes a printed circuit board (PCB) substrate 111 having an upper (first) surface 112 and an opposing lower (second) surface 113, and several integrated circuit (IC) memory devices (e.g., dynamic-random-access memory (DRAM) devices) 120-1 and/or 120-2 that are mounted on at least one of the upper and lower surfaces. PCB substrate 111 includes a network of wiring traces 114 (shown in FIG. 2) that are formed on at least one of upper surface 112 and lower surface 113, and extend through layers of insulating material (e.g., FR4) according to known manufacturing techniques. Selected wiring traces 114 are connected between contact leads 121 of selected memory devices 120 and associated contact pads 115 that are arranged in a row along a lower (connector) edge 116 on both surfaces 112 and 113 of PCB substrate 111. Metal contact pads 115 facilitate pluggable connection of memory module assembly 100 into a host system (e.g., a PC or other computer system) to increase available memory capacity by way of memory devices 120. Referring to FIG. 5, when memory module assembly 100 is mounted into a host system 500, metal contact pads 115 mate with pads 515 on a module socket 510 to electrically connect the module to the host system's motherboard 501. Optional side edge notches 117S, holes 117H, and connector edge notch 117C are provided along side edges 118 and connector edge 116 to ensure that the module is correctly positioned in the socket. Upper edge 119 is located opposite to connector edge 116.

Although generally referred to herein as memory devices, IC devices 120-1 and 120-2 (collectively referred to as IC devices 120) may include one or more additional control IC devices, such as a processor, an application specific integrated circuit (ASIC), and/or a programmable logic device (PLD). Further in addition to IC devices 120, additional electrical and electronic components 124 (shown in FIG. 1(A)), such as capacitors and inductors, may be included on PCB substrate 111 using known techniques.

According to an embodiment of the invention, each memory device is packaged such that its upper surface is planar (e.g., Thin Small Outline Package (TSOP)), and is maintained such that each planar upper surface is parallel to PCB substrate 111. For example, as shown in FIG. 1(A), each memory device 120-1 is mounted on upper surface 112 such that its planar upper surface 122 is maintained parallel to upper surface 112. Similarly, each memory device 120-2 is mounted on lower surface 113 such that its planar upper surface 126 is maintained parallel to lower surface 113.

Referring to FIGS. 1(A) and 3, heat-sink plates 130 and 140 are metal structures formed, for example, from a suitable sheet metal (e.g., copper, aluminum, stainless steel or a metal alloy). As indicated in FIG. 1(A), in one embodiment, heat-sink plate 130 includes a flat peripheral region 131 surrounding a depressed (indented) planar outer surface 133, and a planar underside surface 134 formed on the outside (convex, lower facing) surface opposed to planar outer surface 133. Similarly, heat-sink plate 140 includes a flat peripheral region 141 surrounding a depressed (indented) planar outer surface 143, and a planar underside surface 144 formed on the inside (upward facing) surface opposed to outside surface 143. Underside surfaces 134 and 144 are secured in the manner described below to one or more associated memory devices 120. Note that, as indicated in FIG. 4(B), depression regions defined by planar surfaces 133/143 are formed such that the footprint of these regions encloses all of IC devices 120 (i.e., such that planar underside surfaces 134/144 contact all of upper surfaces 122/126 of IC devices 120-1/120-2). As shown in FIG. 3, one or both heat-sink plates (e.g., plate 130) may include one or more slots S for heat dissipation. Each heat-sink plate 130/140 has a lower edge 137L/147L, side edges 137S/147S, and an upper edge 137U/147U. In addition, as shown in FIG. 3, the side edges of each plate are modified to expose the notches formed in PCB substrate 111 (e.g., plate 130 includes a groove 137S for exposing side notches 117S, as indicated in FIG. 4(A)).

As indicated in FIGS. 1(B), 4(A), 4(B) and 5, when heat-sink plates 130/140 are mounted onto memory module PCBA 110, heat-sink plates 130/140 substantially overlap PCB surfaces 112/113 in such a way that IC devices 120 are protected, but contact pads 115 are exposed for pluggable insertion of contact pads 115 into host socket 510 (shown in FIG. 5). For example, as indicated in FIGS. 4(A) and 5, lower edges 137L/147L of heat-sink plates 130/140 are aligned above connector edge 116 of PCB substrate 111 such that contact pads 115 extends below lower edges 137L/147L of heat-sink plates 130/140, and upper edges 137U/147U of heat-sink plates 130/140 protrude above upper edge 119 of PCB substrate 111. Referring to FIG. 5, an opening (gap) G is provided between heat-sink plates 130/140 and PCB substrate 111 adjacent to upper edges 137U/147U to allow air heated by IC devices 120-1 and 120-2 to escape. Note that side edges 137S/147S and upper edges 137U/147U of heat-sink plates 130/140 may be bent inward/downward to narrow the space therebetween (e.g., gap G) to provide a better protection for the electronic components from potential dust contamination, but this may reduce air flow. The upward air flow (e.g., as indicated by dashed arrows in FIG. 5) induced by free convection will enhance heat dissipation from IC devices 120-1/120-2, and thus reduce the operating temperature of memory module assembly 100. Of course, in addition to the heat dissipated by free convection in the generally upward directions, heat is also dissipated to the surrounding air from the external surfaces of heat-sink plates 130/140 by free convection and radiation.

Referring to FIGS. 1(A), 1(B), 4(A), 4(B) and 5, according to the present invention, adhesive portions 150 are applied to planar upper surfaces 122/126 of selected memory devices 120-1/120-2 and/or to planar underside surfaces 134/144 of heat-sink plates 130/140, and are then sandwiched therebetween in a manner that secures heat-sink plates 130/140 to memory module PCBA 110. For example, as indicated in FIG. 1(B), a discrete adhesive portion 150-1 (shown in dashed lines) is sandwiched between planar underside surface 134 of heat-sink plate 130 and upper surface 122 of an associated IC device 120-11 (also shown in dashed lines) such that heat-sink plate 130 is secured to memory module PCBA 110 by adhesive portion 150-1. Similarly, a second discrete adhesive portion 150-2 is sandwiched between planar underside surface 144 of heat-sink plate 140 and upper surface 126 of an associated IC device 125-21 (also shown in dashed lines) such that heat-sink plate 140 is secured to memory module PCBA 110 by adhesive portion 150-2. By securing heat-sink plates 130/140 to memory module 110 using adhesive portions 150 instead of fasteners, the manufacturing process for producing memory module assemblies 100 is greatly simplified, and in addition tampering (i.e., removal of heat-sink plates 130/140 to access IC devices 120/125) is more reliably prevented and more easily detected.

According to an embodiment of the present invention, adhesive portions 150 comprise heat-activated adhesive that is applied to either upper surfaces 122/126 of one or more IC devices 120-1/120-2, or to the planar underside surfaces 134/144 of heat-sink plates 130/140. In this embodiment, the heat-activated adhesive 150 is softened (i.e., exhibits a relatively low adherence) when heated to a high temperature (i.e., equal to or less than the maximum operating temperature of the memory module assembly), and the heat-activated adhesive exhibits a high adherence when subsequently cooled. The advantage of such heat-activated adhesives is that they can be removed by heating, and thus enable reworking. In this case, subsequent removal of the heat-sink plates from the memory module PCBA requires reheating at a predetermined temperature to reflow the adhesive. Heat-activated adhesives of this type are typically produced in the form of thin film or tape can be used for IC devices that generate less heat, and the main purpose of heat-sink plates 130/140 is thus relegated to mainly protecting the IC devices. Such heat-activated adhesive material forms a thin and continuous layer between the heat-sink plate and the upper external surface of the IC devices. As the newly formed interface layer is thin and can be made substantially void-free (i.e., very few air bubbles), the thermal resistance through the adhesive layer is relatively small. The ability to rework, for example through heating, becomes an important consideration. Thermoplastic based adhesive material such as thermal bonding film (e.g., product numbers TBF615, TBF668) produced by 3M of St. Paul Minn., or hot melt film (e.g., product number 7802) produced by Henkel Loctite Corp. (Industrial) of Rocky Hill Conn. can be used as an adhesive in this application.

While heat-activated adhesives provide an advantage in that they can be reworked by reheating, such adhesives typically exhibit relatively low thermal conductivity, thus making them less desirable in applications that require a high level of heat dissipation through the heat-sink plates.

In another embodiment, adhesive portions 150 comprise an adhesive material that is "cured" during a heating process (i.e., exhibits an initial, relatively low adherence when applied, and a relatively high adherence after being heat-cured). Such heat-cured adhesives typically exhibit relatively high thermal conductivity relative to heat-activated adhesives, and are therefore more desirable in applications that require a high level of heat dissipation through the heat-sink plates. The heat-cured adhesive material is applied in the form of paste, and is re-distributed under heat and pressure during curing to bond the IC devices and heat-sink plates together. The curing process takes place at elevated temperature, and can be expedited with the use of activator. The re-distribution process causes the adhesive material to flow and fill the void between the heat sink plate and memory surface, resulting in a thin, good contact therebetween that reduces thermal resistance from the heat source (IC device) to the heat-sink plate. A dispensing machine can be used to ensure even distribution of the adhesive material. In one embodiment, the heat-cured adhesive consists of silicone elastomer-based resin for re-workability and survivability at elevated temperature that the electronic components may encounter. Metallic fillers may be added to improve thermal conductivity. On suitable heat-cured adhesive is provided by Dow Corning (e.g., product number 3-6752). Such adhesives are removed using solvent to enable rework.

Although heat-activated and heat-cured adhesive materials provide superior connection between the heat-sink plates and memory module PCBA, it is also possible to use other types of adhesives in the manner described herein to provide suitable connections. Therefore, unless otherwise specified in the appended claims, the term "adhesive portion" is intended to include any non-corrosive adhesive that can reliably connect the heat-sink plates and memory module PCBAs described herein.

In addition, although the present invention is described above with certain benefits associated with attaching heat-sink plates 130 and 140 to memory module PCBA 110 solely by adhesive portions 150, in some embodiments an optional fastener (e.g., a screw 160, rivet or clamp, which is shown in dashed lines in FIG. 1(B)) or clip may be utilized to provide a more sturdy and reliable engagement arrangement. Exemplary embodiments utilizing low-profile clips are described below with reference to FIGS. 6(A) to 8(C).

The embodiment described above with reference to FIGS. 1(A) to 5 includes heat-sink plate edge features that maximize cooling efficiency by allowing essentially unimpeded airflow under the heat sink plates (i.e., between the heat sink plates and the PCB substrate). Even though the area between the heat sink and substrate is small and mostly occupied by the IC (e.g., memory and controller) devices, small gaps between adjacent pairs of IC devices can channel air flow past the IC devices, directly cooling the IC devices as well as cooling the heat sink plate from both the underside surface and its larger, exposed top surface. The inventors encourage this airflow through the tiny channels between IC devices by maintaining openings (e.g., gap G shown in FIG. 5) near the top edge of the memory module assembly. These openings allow air to escape from between the PCB substrate and the heat sink plates. Air enters the gaps between the heat sink and the PCB substrate from the open bottom edge near the lower connector edge, and flows between the memory devices and out the top-edge openings. Stagnant air under the heat sink plates is thus reduced.

Figure 6A:
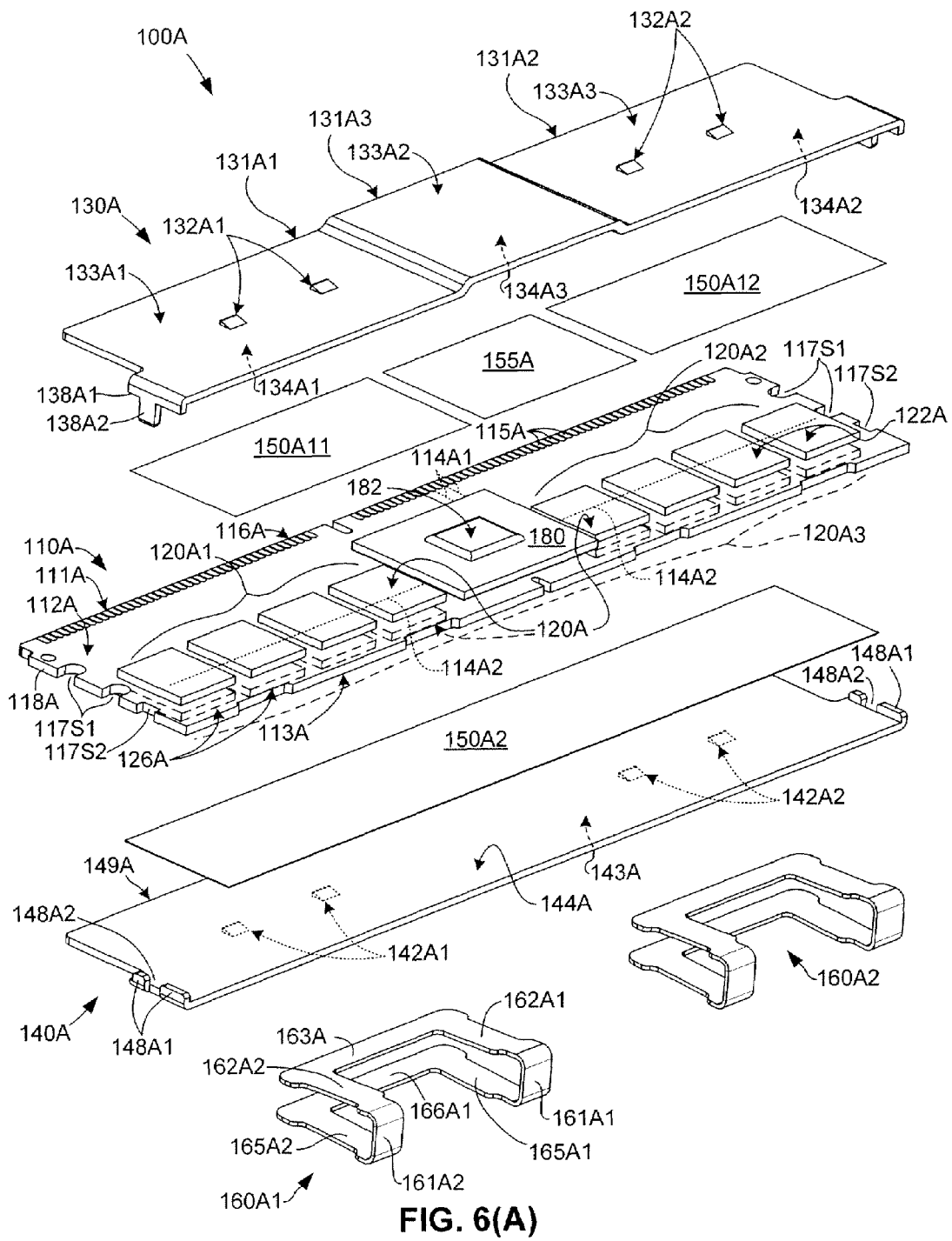
FIGS. 6(A), 6(B), 6(C) and 6(D) are exploded perspective, front assembled perspective, rear assembled perspective, and cross-sectional side views showing a FB-DIMM type memory module assembly according to another embodiment of the present invention.
Figure 6B:
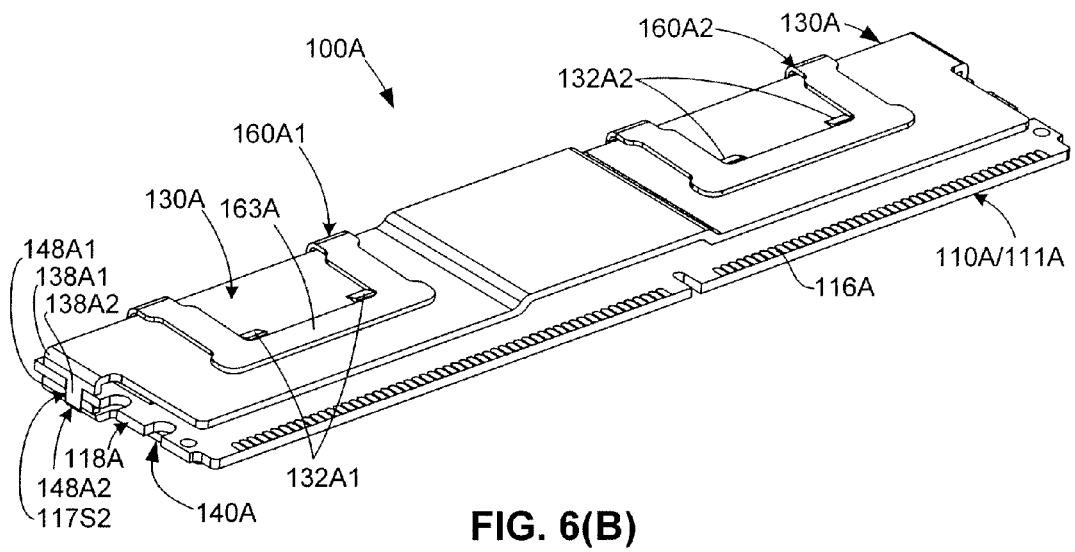

FIGS. 6(A) and 6(B) are exploded perspective and cross-sectional side views showing a FB-DIMM-type memory module assembly 100A according to another embodiment of the present invention. Memory module assembly 100A includes an FB-DIMM printed circuit board assembly (PCBA) 110A, a first heat-sink plate 130A attached to PCBA 110A by adhesive portions 150A1, 150A2 and 155A, and a second heat-sink plate 140A attached to PCBA 110A by an adhesive portion 150A2.

Similar to PCBA 110 (described above), FB-DIMM PCBA 110A includes a substrate 111A having opposing first and second surfaces 112A and 113A, and (first) wiring traces 114A1 connected to associated metal contact pads 115A that are disposed along a connector edge 116A of substrate 111A. In addition, several memory (first IC) devices 120A (e.g., DRAM devices) which are mounted on upper surface 112A and 113A. Memory devices 120A are arranged on upper surface 112A in two groups: a first group 120A1 and a second group 120A2. As in the previous embodiments, upper surfaces 122A of devices 120A1 and 120A2 substantially define a first plane P1 (shown in FIG. 6(D)) that is parallel to first surface 112A of substrate 111A. Memory devices 120A3 are arranged on lower surface 113A such that upper surfaces 126A of devices 120A3 substantially define a plane P3 (shown in FIG. 6(D)) that is parallel to surface 113A.

FB-DIMM PCBA 110A differs from PCBA 110 in that it includes an advanced memory buffer (AMB) device 180 disposed on the first surface 112A between device groups 120A1 and 120A2. AMB devices (e.g., produced by NEC Electronics of Japan) are recently developed IC devices utilized to configure FB-DIMMs in a way that greatly improves communications between FB-DIMM PCBA 110A and a host system. In general, AMB device 180 is connected to "upstream" and "downstream" serial links by way of traces 114A1, and is connected to DRAM devices 120A1, 120A2 and 120A3 by way of the bus indicated by dashed line 114A2. Serial data from the host memory controller sent through the downstream serial link (southbound) is temporarily buffered by AMB device 180, and then sent to DRAM devices 120A1, 120A2 and 120A3. The serial data contains the address, data and command information given to the DRAM, converted in AMB 180 and sent out to the DRAM bus. AMB 180 writes in and reads out from the DRAM devices as instructed by the host system memory controller (not shown). The read data is converted to serial data, and sent back to the memory controller on the upstream serial link (northbound). Other features and functions performed by AMB 180 are known to those skilled in the art of producing memory modules.

Figure 6C:
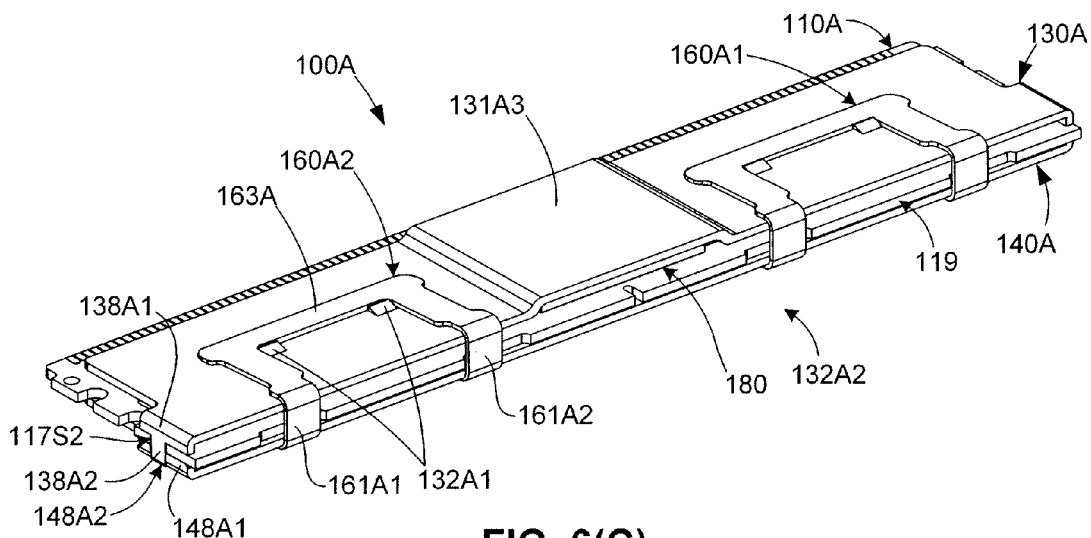
Figure 6D:
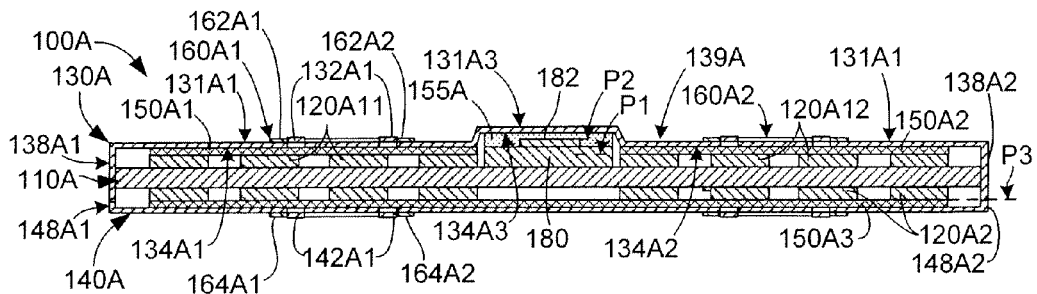

As indicated in FIG. 6(D), features typical of AMB device 180 are that it has a taller profile than DRAM devices 120A1 and 120A2, and it is housed in a Ball Grid Array (BGA) package. In particular, an upper surface 182 of AMB device 180 defines a (second) plane P2 that is parallel to substrate surface 112A, and is located above plane P1 defined by DRAM devices 120A1 and 120A2 (i.e., plane P1 is located between plane P2 and surface 112A). As is understood in the art, BGA packaged devices are connected to underlying substrates (e.g., PCB 111A) by way of solder or solder-like connections that are relatively brittle (i.e., in comparison to the pin-type connections utilized to mount DRAMs 120A1 and 120A2). These relatively brittle connections typically require protection from mechanical shock to prevent cracking of the connections that can result in electrical disconnection.

Similar to the embodiments described above, heat-sink plate 130A includes recessed regions 131A1 and 131A2 that respectively include planar outer surfaces 133A1 and 133A2 and planar underside surfaces 134A1 and 134A2, and these regions are secured to the upper surfaces 122A of DRAM devices 120A1 and 120A2, respectively, by way of thermal-bond adhesive film portions 150A1 and 150A2. In particular, adhesive film portion 150A1 is sandwiched between planar underside surface 134A1 and the upper surface 122A of DRAM devices 120A1. Similarly, adhesive film portion 150A2 is sandwiched between planar underside surface 134A2 and upper surfaces 122A of DRAM devices 1202. Thus, heat-sink plate 130A is rigidly secured to PCBA 110A by adhesive film portions 150A1 and 150A2 in a manner similar to that described above. Similarly, lower heat-sink plate 140A includes a substantially planar underside surface 144A that is secured by way of a thermal-bond adhesive film portion 150A3 to upper surfaces 126A of DRAM devices 120A3, thereby securing lower heat-sink plate 140A to PCBA 110A. When the IC memory chips are BGA (Ball Grid Array) or CSP (Chip Scale Package), using epoxy underfill to fortify the adhesion between IC chips and PCB package increases the memory module's strength and reliability by providing an additional protection against shock, vibration and bending stiffness of the memory module.

In accordance with another aspect of the present invention, in order to accommodate the taller profile of AMB device 180, heat-sink plate 130A includes a raised pocket region 131A3 that is disposed between recessed regions 131A1 and 131A2, and has a planar underside surface 134A3 that is positioned above (i.e., further from substrate 111A than) planar underside surfaces 134A1 and 134A2 (as indicated in FIG. 6(B)). Further, in order to minimize mechanical shock while providing suitable heat transfer between AMB device 180 and raised pocket region 131A3, thermal paste portion 155A is optionally disposed between the upper surface 182 of the AMB device 180 and the planar underside surface 134A3. In one embodiment, thermal compound 155A includes one of a thermal paste produced by Vantec Thermal Technologies of Freemont, Calif. USA, a silicone compound (SIL More, Taiwan), Chomerics pad, or Honeywell PCM45F. In another embodiment (not shown), thermal paste portion 155A is omitted, and AMB device 180 is directly contacted by underside surface 134A3 of upper heat-sink plate 130 for heat dissipation.

Referring again to FIG. 6(A), FB-DIMM PCBA 110A further differs from PCBA 110 in that, in addition to slots 117S1 formed on side edges 118A that are similar to slots 117S described above, substrate 111A also includes positioning notches 117S2 that are utilized to properly align heat-sink plates 130A and 140A during assembly in the manner described below.

In accordance with another aspect of the present invention, when both heat-sink plate 130A and 140A are mounted onto PCBA 110B (as indicated in FIGS. 6(B) and 6(C)), upper heat-sink plate 130A and lower heat-sink plate 140A contact surfaces 112A and 113A, respectively, adjacent to side edges 118A, thereby forming a rigid frame that further protects AMB device 180 from mechanical shock. In particular, as indicated in FIG. 6(A), heat-sink plate 130A includes side wall structures 138A1 and tabs 138A2 that extend downward from side wall structures 138A1. Conversely, lower heat-sink plate 140A includes a side wall support structure 148A1 that defines a groove 148A2. As shown in FIGS. 6(B) and 6(C), when mounted onto PCBA 110A, side wall structures 138A1 of upper heat-sink plate 130A contact upper surface 112A adjacent to side edges 118A, and side wall structures 148A1 of upper heat-sink plate 140A contact lower surface 113A adjacent to side edges 118A, thereby sandwiching the outer side edge portions of PCBA 110A between side wall structures 138A1 and 148A1. In addition, tabs 138A2 of heat-sink plate 130A extend from side wall structures 138A1 through notches 117S2, and are received in grooves 148A2 defined by side wall support structure 148A1 of lower heat-sink plate 140A. This tab/groove arrangement facilitates reliable and cost effective assembly by facilitating substantially foolproof alignment of heat-sink plates 130A and 140A to PCBA 110A without the need for manual adjustment. That is, heat-sink plates 130A and 140A can only be mounted onto PCBA 110A when tabs 138A2 extend through notches 117S2 and are received in notches 148A2—any other assembly arrangement will be immediately noticed due to the improper orientation of plates 130A and/or 140A, and thus easily corrected.

In accordance with yet another aspect of the present invention, FB-DIMM-type memory module assembly 100A further includes two single-piece clips 160A1 and 160A2 that are used to press heat-sink plates 130A and 140A onto opposing surfaces 112A and 113A of PCBA 110A, thus providing a more sturdy and reliable engagement arrangement. The term "single-piece" is used herein to indicate that clips 160A1 and 160A2 are produced from an integral sheet of a suitable resilient material (e.g., spring steel) that has been patterned, bent and/or otherwise formed using conventional techniques to generate the desired shape. Each single-piece clip 160A1 and 160A2 is formed from such that, when mounted onto heat-sink plates 130A and 140A in the manner shown in FIGS. 6(B) to 6(D), single-piece clips 160A1 and 160A2 press heat-sink plates 130A and 140A toward PCBA 110A, thereby sandwiching PCBA 110A therebetween. Referring to the left side of FIG. 6(A), single-piece clip 160A1 includes first and second linking members 161A1 and 161A2, a first engaging portion formed by side arms 162A1 and 162A2 and end portion 163A, and a second engaging portion formed by side arms 165A1 and 165A2 and end portion 166A. Side arms 162A1 and 162A2 are connected at first ends to upper ends of first and second linking members 161A1 and 161A2, respectively, and end portion 163A extends between second ends of side arms 162A1 and 162A2. Similarly, side arms 165A1 and 165A2 are connected at first ends to lower ends of first and second linking members 161A1 and 161A2, respectively, and end portion 166A extends between second ends of side arms 162A1 and 165A2. Single-piece clip 160A2 is substantially identical to single-piece clip 160A1. Referring to FIG. 6(B) to 6(D), when single-piece clip 160A1 is operably mounted onto heat-sink plates 130A and 140A, side arms 162A1 and 162A2 and end portion 163A are connected to outer surface portion 133A1 of heat-sink plate 130A, side arms 165A1 and 165A2 and end portion 166A are connected to the second outer surface portion 143A1 of the second heat-sink plate 140A, and side arms 160A1 and 165A2 serve to press these engaging portions against heat-sink plates 130A and 140A. Single-piece clip 160A2 is mounted in a similar manner onto outer surface portions 133A2 and 143A2, thereby securing PCBA 110A between heat-sink plates 130A and 140A. In addition to the integral portions described above, single-piece clips 160A1 and 160A2 may include additional, non-integral structures (e.g., wire levers similar to those found on a binder clip).

In accordance with another aspect of the present invention, heat-sink plates 130A and 140A respectively include hooks 132A1, 132A2, 142A1 and 142A2 for reliably securing single-piece clips 160A1 and 160A2 onto heat-sink plates 130A and 140A. As indicated in FIG. 6(A), hooks 132A1 protrude from outer surface portion 133A1 of heat-sink plate 130A, and hooks 132A2 protrude from outer surface portion 133A2. Similarly, hooks 142A1 protrude from outer surface portion 143A1 of heat-sink plate 140A, and hooks 142A2 protrude from outer surface portion 143A2. Single-piece clip 160A1 is constructed such that, when operably mounted onto heat-sink plates 130A and 140A, end portion 163A engages hooks 132A1, and end portion 166A engages hooks 142A1. Similarly, clip 160A2 engages hooks 132A2 and 142A2. Thus, when both heat-sink plate 130A and 140A are mounted onto PCBA 110A and clips 160A1 and 160A2 are engaged (as indicated in FIGS. 6(B) and 6(C)), upper heat-sink plate 130A and lower heat-sink plate 140A are reliably and rigidly held against surfaces 112A and 113A, respectively, adjacent to side edges 118A, thereby forming a rigid frame that further protects AMB device 180 from mechanical shock.

Figure 7A:
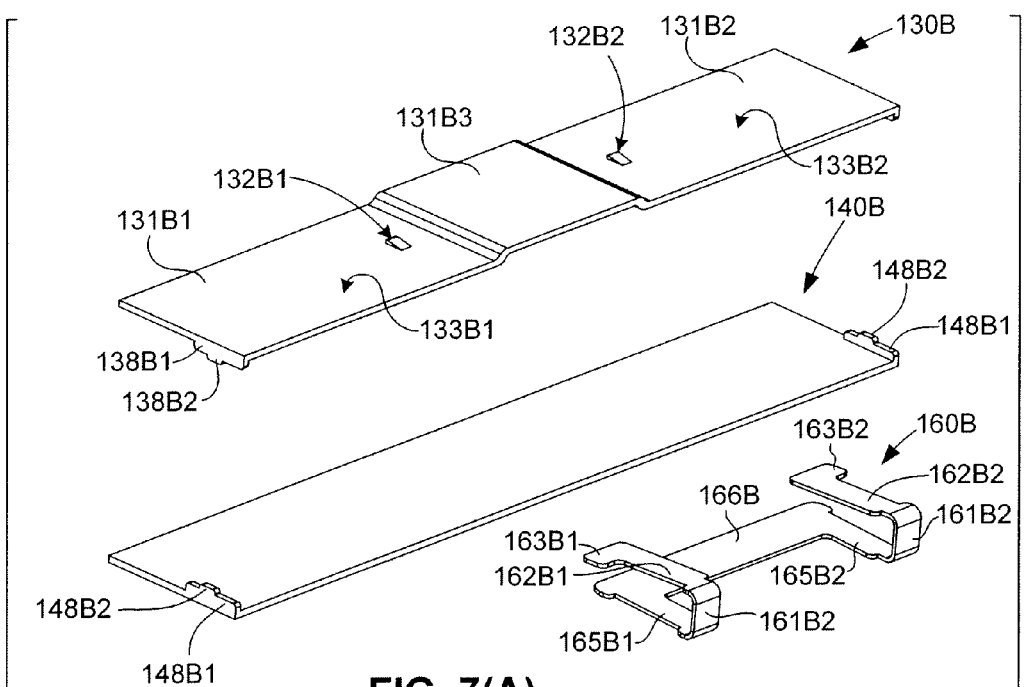
FIGS. 7(A), 7(B) and 7(C) are exploded perspective, front assembled perspective, rear assembled perspective views showing a FB-DIMM type memory module assembly according to another embodiment of the present invention.
Figure 7B:
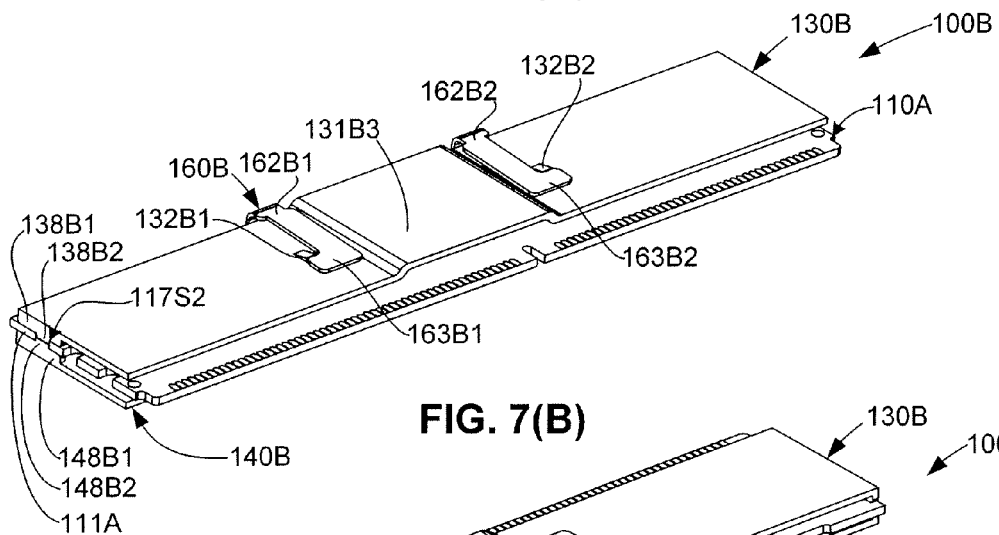
Figure 7C:
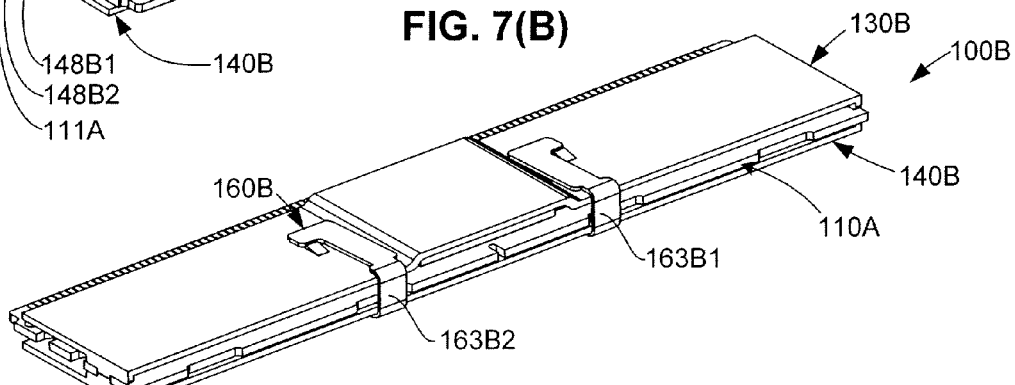

FIGS. 7(A), 7(B) and 7(C) are exploded perspective and assembled perspective views showing a FB-DIMM-type memory module assembly 100B according to another embodiment of the present invention. Memory module assembly 100B includes an upper heat-sink plate 130B, a lower heat-sink plate 140B, and a single-piece clip 160B. Omitted from FIG. 7(A) for clarity are FB-DIMM PCBA 110A (discussed above) and adhesive portions that are mounted between opposing sides of PCBA 110A and upper heat-sink plate 130B and lower heat-sink plate 140B, respectively, in the manner described above. Similar to the structure described above, upper heat-sink plate 130B includes first and second recessed portions 131B1 and 131B2 that are separated by a raised pocket structure 131B3. Single piece clip 160B is attached to upper heat-sink plate 130B and lower heat-sink plate 140B, and heat-sink plate 130B and 140B are attached to PCBA 110A in a manner similar to the method described above with the following exceptions.

First, heat-sink plates 130B and 140B include side wall structures 132B1 and 142B1 that are similar to those of heat-sink plates 130A and 140A, but instead of including a single tab that extends the entire length of groove 117S2, heat-sink plate 130A and 140A includes shorter tab portions 138B2 and 148B2, respectively, that extend partially into groove 117S2 as shown in FIGS. 7(B) and 7(C). Tab portions 138B2 and 148B2 function to align heat-sink plates 130B and 140B during assembly in a manner similar to that provided by the full length tab associated with memory module assembly 100A (described above).

Second, memory module assembly 100B differs from memory module assembly 100A in that it utilizes a single single-piece clip 160B to press and secure heat-sink plates 130B and 140B onto PCBA 110A. In particular, a first hook 132B1 is formed on upper surface portion 133B1 of first recessed region 131B1, and a second hook 132B2 is formed on upper surface portion 133B2 of second recessed region 131B2. Single-piece clip 160B includes a first engaging portion 163B1 disposed on a first side arm 162B1, a second engaging portion 163B2 disposed on a second side arm 162B2, and linking members 161B1 and 161B2 respectively connected between side arms 162B1 and 162B2 and a lower (second) engaging portion formed by lower side arms 165B1 and 165B2 and an end portion 166B. When single-piece clip 160B is mounted onto heat-sink plates 130B and 140B, first engaging portion 163B1 is connected to first hook 132B1 on a first side of raised pocket structure 131B3, and second engaging portion 163B2 is connected to second hook 132B2 on the opposite side of raised pocket structure 131B3, thereby providing a uniform pressing force using a single clip.

Figure 8A:
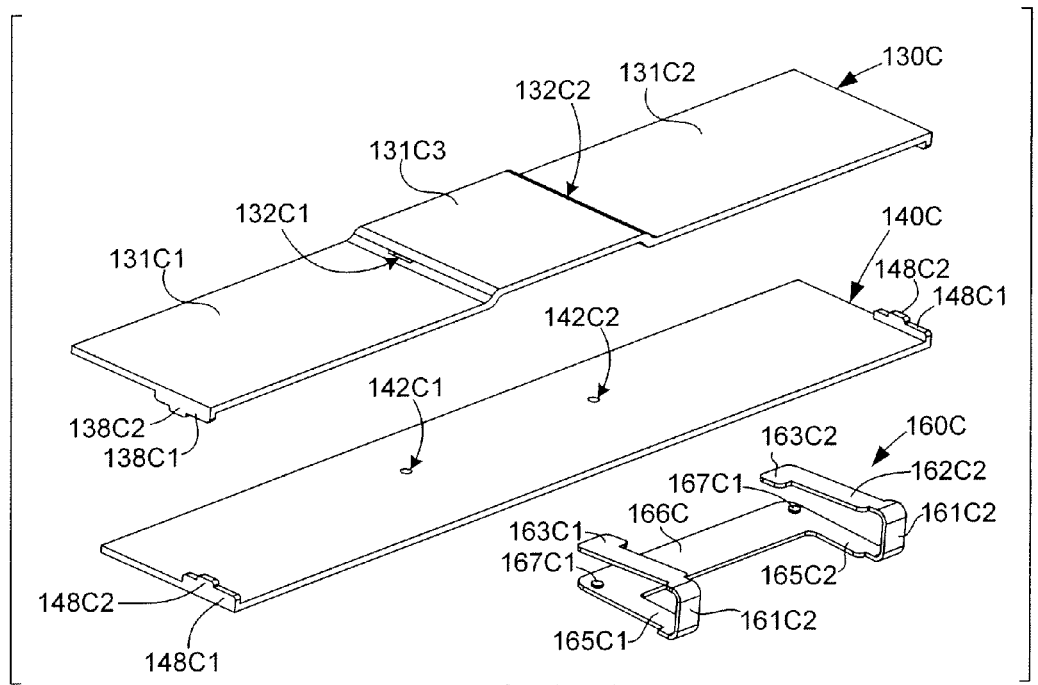
FIGS. 8(A), 8(B) and 8(C) are exploded perspective, front assembled perspective, and rear assembled perspective views showing a FB-DIMM type memory module assembly according to another embodiment of the present invention.
Figure 8B:
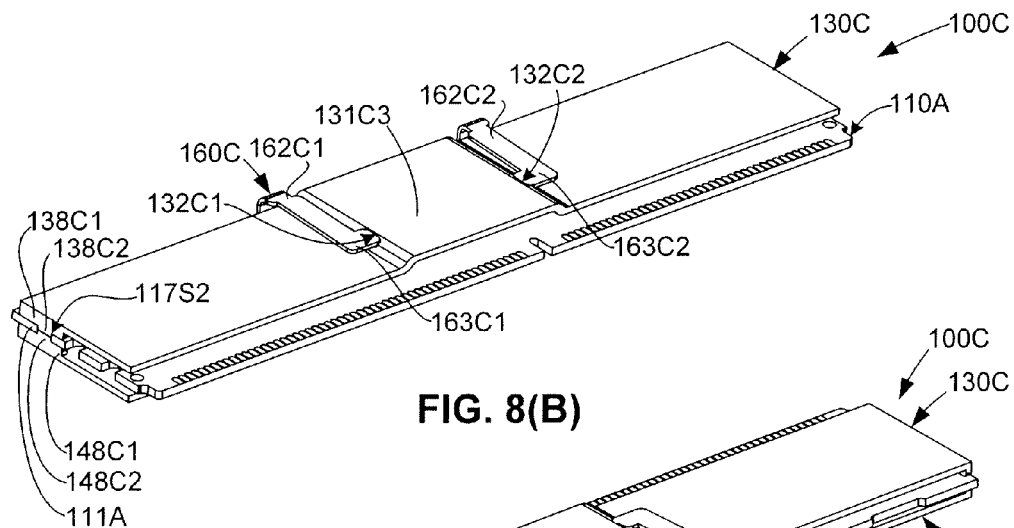
Figure 8C:
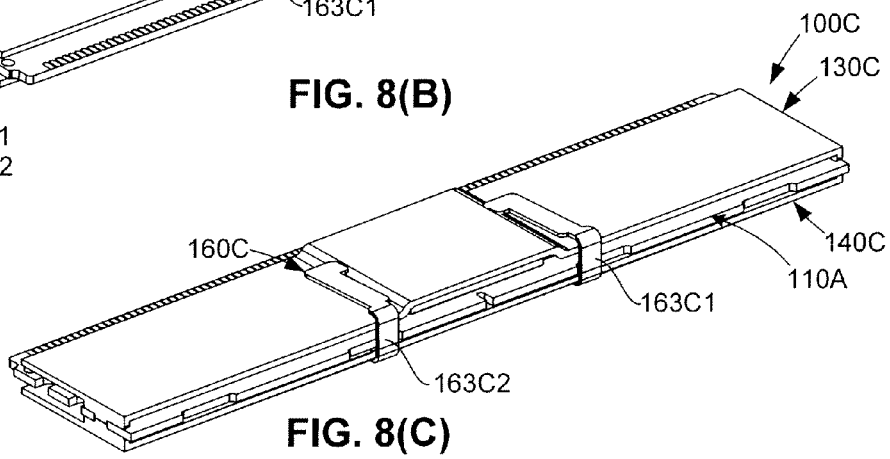

FIGS. 8(A), 8(B) and 8(C) are exploded perspective and assembled perspective views showing a FB-DIMM-type memory module assembly 100C according to another embodiment of the present invention. Omitted from FIG. 8(A) for clarity are FB-DIMM PCBA 110A (discussed above) and adhesive portions that are mounted between opposing sides of PCBA 110A and upper heat-sink plate 130C and lower heat-sink plate 140C, respectively, in the manner described above. Similar to the structure described above, upper heat-sink plate 130C includes first and second recessed portions 131C1 and 131C2 that are separated by a raised pocket structure 131C3. Upper heat-sink plate 130C and lower heat-sink plate 140C are attached to FB-DIMM PCBA 110A by single-piece clip 160C in a manner similar to the method described above with reference to FIGS. 7(A) to 7(C) except in the manner in which single-piece clip 160C is secured to heat-sink plates 130C and 140C. In particular, instead of hooks, a first slot 132C1 is defined in a first side edge of raised pocket structure 131C3, a second slot 132C2 is defined in the opposite side edge of raised pocket structure 131C3, and lower heat-sink plate 140C defines a pair of holes 142D1 and 142D2. In addition, single-piece clip 160C includes a first engaging portion 163C1 disposed on a first side arm 162C1, a second engaging portion 163C2 disposed on a second side arm 162C2, and linking members 161C1 and 161C2 respectively connected between side arms 162C1 and 162C2 and a lower (second) engaging portion formed by lower side arms 165C1 and 165C2 and an end portion 166C. Positioning pins 167C1 and 167C2 protrude upward from end portion 166C. When single-piece clip 160C is mounted onto heat-sink plates 130C and 140C, first engaging portion 163C1 is inserted into first slot 132C1 on a first side of raised pocket structure 131C3, second engaging portion 163C2 is inserted into second hook 132C2 on the opposite side of raised pocket structure 131C3, and positioning pins 167C1 and 167C2 are inserted into holes 142C1 and 142C2, respectively, thereby reliably securing clip 160C to heat-sink plates 130C and 140C.

Several other embodiments are contemplated by the inventors. For example the heat sink may be made from a variety of heat-conducting materials such as aluminum, aluminum alloy, copper, brass, bronze, stainless steel, etc.

Figure 9:
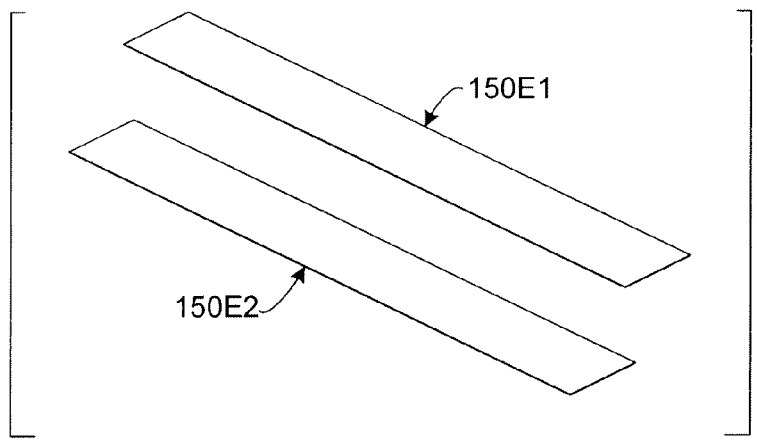
FIG. 9 is a simplified perspective view showing adhesive layers associated with FB-DIMM type memory module assembly according to another embodiment of the present invention.
Figure 10:
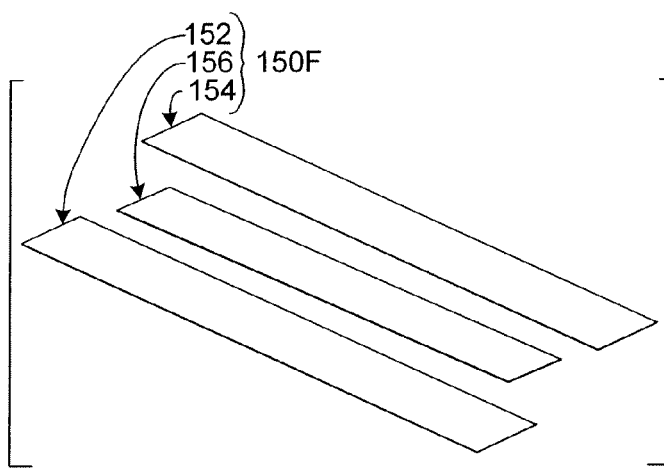
FIG. 10 is a simplified perspective view showing adhesive layers associated with FB-DIMM type memory module assembly according to another embodiment of the present invention.
Figure 11:
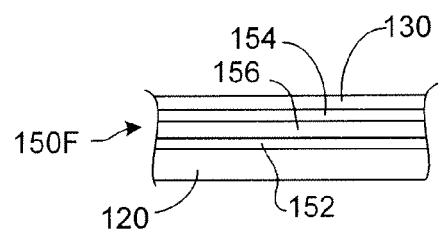
FIG. 11 is a cross-section side view showing the adhesive layers of FIG. 10 attached to a FB-DIMM type memory module assembly.

In addition, the adhesive arrangements utilized in the embodiments described above are intended to be exemplary, and may be altered to facilitate better adherence and/or heat transfer characteristics of the resulting memory module assembly. For example, FIG. 9 shows upper and lower thermal paste layers 150E1 and 150E2 that may be respectively disposed between the heat-sink plates and PCBA in accordance with an alternative embodiment. Alternatively, as shown in FIGS. 10 and 11, a laminated adhesive structure 150F may be utilized to secure, for example, IC devices 120 to upper heat-sink plate 130. In the disclosed embodiment, laminated adhesive structure 150F includes a lower adhesive film 152, an upper adhesive film 154, and a thermal paste layer 156 disposed between the upper and lower adhesive films.

Figure 12:
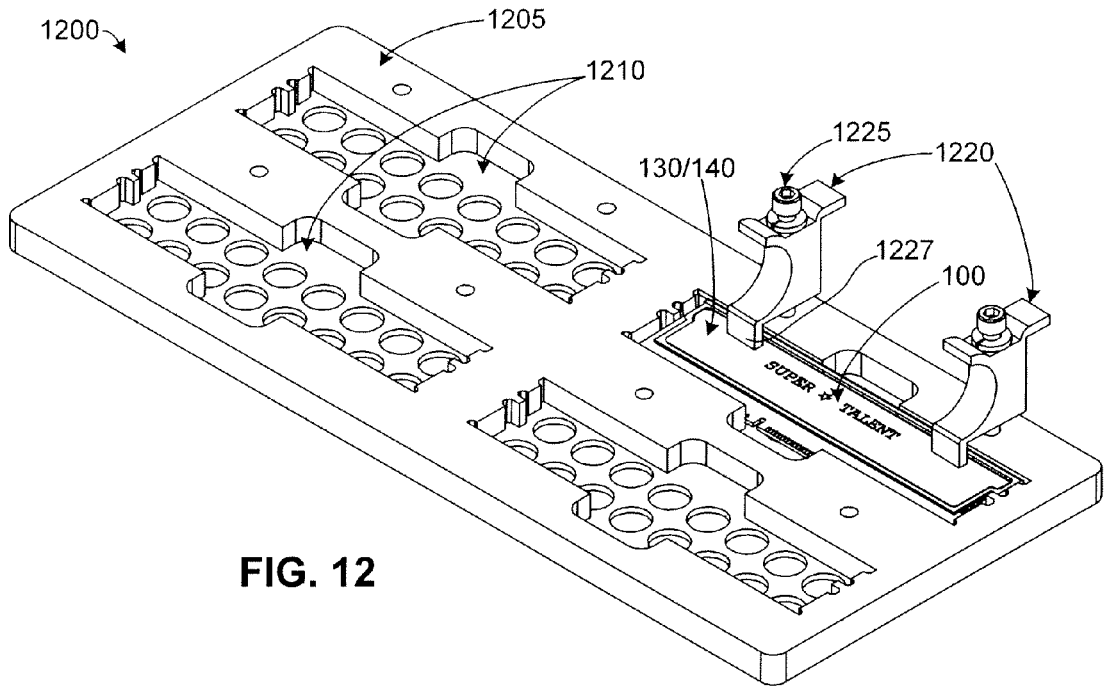
FIG. 12 is a perspective view showing a heat treatment fixture according to another embodiment of the present invention.

FIG. 12 is a perspective view showing a heat-sink reflow fixture 1200 utilized in a process for assembling FB-DIMM memory modules 100 according to another embodiment of the present invention. The memory modules assembled using fixture 1200 may include any of the modules described in the embodiments set forth above. Fixture 1200 includes a base 1205 defining a plurality of recesses 1210 for receiving FB-DIMM memory modules 100 in the depicted manner. Two spring clamps 1220 are mounted onto base 1205 and include adjustment screws 1225 that, when turned, press contact points 1227 against heat-sink plate 130 or heat-sink plate 140 of memory module 100, thereby securing memory module 100 in a fixed manner for heat treatment. Although four recesses 1210 are shown, the number of recesses may be increased or decreased to maximize the efficiency of the heat treatment process.

Figure 13:
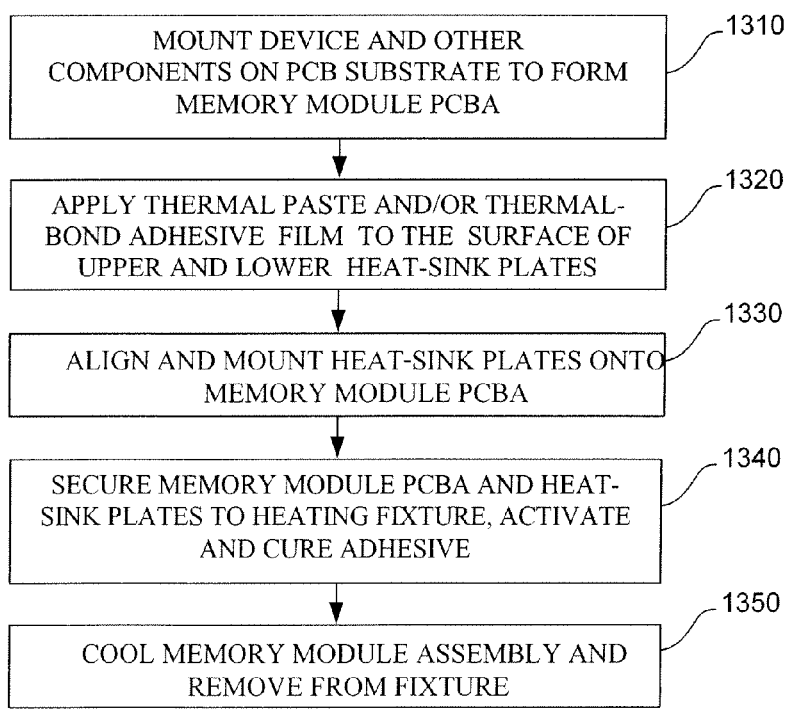
FIG. 13 is a flow diagram showing a process for manufacturing FB-DIMM type memory module assemblies according to another embodiment of the present invention.

FIG. 13 is a flow diagram showing a process of assembling FB-DIMM memory modules 100 utilizing heat-sink reflow fixture 1200 of FIG. 12. In block 1310, the various IC devices (e.g., memory devices and AMB devices) and other components are mounted onto the PCB substrate to form the memory module PCBA (e.g., PCBA 110, discussed above). In block 1320, one or more of the adhesive portions describe above are applied to the upper and lower heat-sink plates (e.g., heat-sink plates 130 and 140). The adhesive can be applied to the heat-sink surface by manual or automatic using dispensing machine. Next, immediately after dispensing the adhesive, the upper and lower heat-sink plates are mounted and aligned onto the memory module PCBA to form a memory module assembly using the methods described above (block 1330). In block 1340, the memory module assembly are mounted and secured by spring clamps 1220 into a corresponding recess 1210 of fixture 1200, and then the fixture is passed through an oven or otherwise subjected to an appropriate temperature (i.e., at or lower than the maximum safe operating temperature for the memory module components, e.g., 80° C. for approximately 15 minutes) to activate and/or cure the adhesive material. Finally, in block 1350, the memory module assembly is allowed to cool and is then removed from fixture 1200. For subsequent re-work to separate the PCBA from the heat-sink plates, the memory module assembly may be subjected to a temperature of about 150° C. for several seconds to remove the adhesives.

Figure 14:
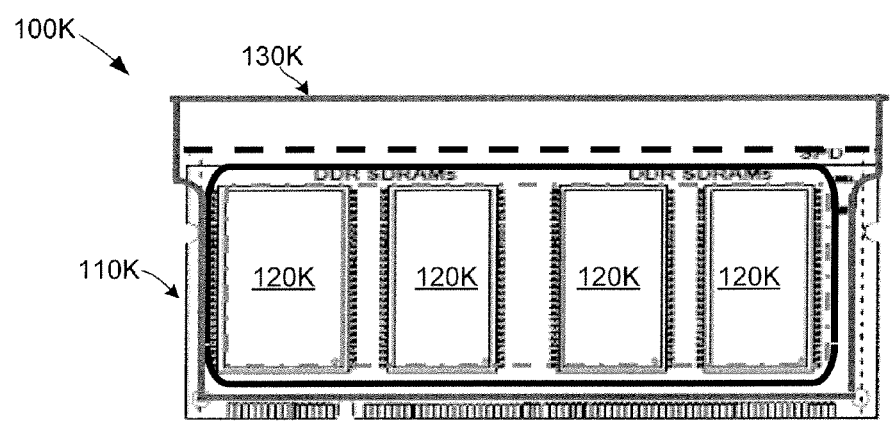
FIG. 14 is a top view showing a memory module assembly according to another embodiment of the present invention.
Figure 15:
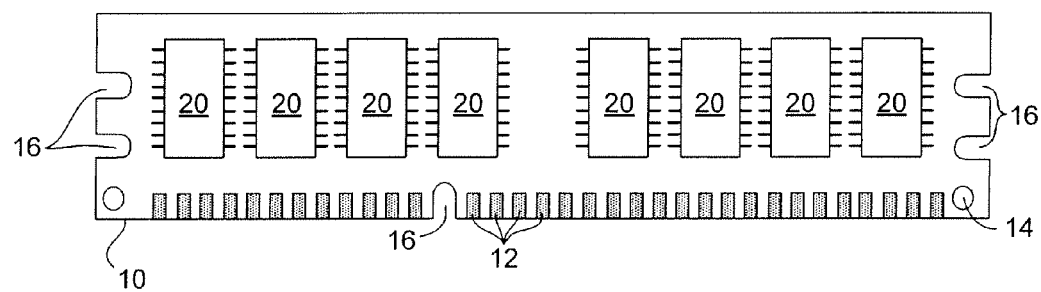
FIG. 15 is a top view showing a conventional memory module PCBA.

FIG. 14 is a modified top view showing a memory module assembly 100K according to yet another embodiment of the present invention. Memory module assembly 100K differs from previously described embodiments in that it includes a memory module PCBA 110K that is in the form of a Small Outline Dual Inline memory Module (SODIMM). This type of memory module is used mostly for notebook computers, with Thin Small Outline Package (TSOP). The number of memory devices 120K is typically reduced in half, with each side of memory module assembly 100K including a row of up to four devices. Adhesive is applied according to the previously described embodiments to the memory devices or the inside of the heat-sink plates (e.g., heat sink plate 130K), before the heat sink plates are attached to the memory module PCBA 110K. All the other features of memory module assembly 100K are similar to those described above. Further, in addition to the SODIMM arrangement shown in FIG. 12, the present invention may be incorporated into memory module assemblies including any of a Single Inline Memory Module (SIMM) device, a Dual Inline Memory Module (DIMM) device, and a Small Outline DIMM (SODIMM) device.

Terms such as "upper edge", "side edge", "lower edge", "front surface", "outer surface" and "underside surface" are arbitrarily assigned as shown in the figures and each term could refer to either surface of the module and/or heat-sink structure. Vias of through-holes may provide electrical connection between the surfaces or intermediate layers. These through-holes could be filled in holes or metal traces between layers rather than open holes, and can also be formed during the PCB processing as an integral part of the PCB. Various alternatives in geometries of the heat-sink plates and memory modules could be substituted.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

The invention claimed is:

1. A memory module assembly comprising:
   a memory module printed circuit board assembly (PCBA) including:
      a substrate having opposing first and second surfaces, a plurality of wiring traces formed on the first and second surfaces, at least some of the wiring traces being connected to metal contact pads formed along a connector edge of the substrate, and
      a plurality of first integrated circuit (IC) devices mounted on the first surface of the substrate such that an upper surface of each of the plurality of first IC devices faces away from the substrate, and
      a plurality of second IC devices mounted on the second surface of the substrate such that an upper surface of each of the plurality of second IC devices faces away from the substrate;
   a first heat-sink plate having a first outer surface and an opposing first underside surface;
   a second heat-sink plate having a second outer surface and an opposing second underside surface;
   a plurality of adhesive portions including a first adhesive portion sandwiched between the first underside surface of the first heat-sink plate and the upper surface of an associated IC device of said plurality of first IC devices, and a second adhesive portion sandwiched between the second underside surface of the second heat-sink plate and the upper surface of an associated IC device of said plurality of second IC devices; and
   means for pressing the first and second heat-sink plates onto the first and second surfaces, respectively, such that the first and second heat-sink plates are rigidly secured to the substrate,
   wherein a first plurality of said first integrated circuit (IC) devices and a second plurality of said first IC devices are disposed on the first surface of the substrate such that upper surfaces of the first and second pluralities of first IC devices define a first plane that is parallel to the first surface of the substrate,
   wherein the memory module PCBA further comprises a third IC device disposed on the first surface between the first and second pluralities of first devices, the second IC device having an upper surface defining a second plane that is parallel to the first surface of the substrate, wherein the first plane is located between the second plane and the first surface of the substrate, and
   wherein the first heat-sink plate includes a first recessed region having a first upper surface region and an opposing first planar underside surface region, a second recessed region having a second upper surface region and an opposing second planar underside surface region, and a raised pocket structure defining a third upper surface region and an opposing third planar underside surface region, the pocket region being disposed between the first and second recessed regions.

2. The memory module assembly of claim 1,
   wherein the substrate further comprises second wiring traces forming a bus,
   wherein the first IC devices and the second IC devices comprise dynamic random access memory (DRAM) devices connected to the bus, and
   wherein the third IC device comprises an advanced memory buffer (AMB) device that is connected to each of the first and second pluralities of first IC devices by way of the bus, the AMB device also being connected to said plurality of first wiring traces.

3. The memory module assembly of claim 1,
   wherein at least one side edge of the substrate defines a positioning notch,
   wherein the first and second heat-sink plates comprise side wall structures, each side wall structure abutting a corresponding one of said first and second surfaces adjacent to said at least one side edge, and
   wherein at least one of the first and second heat-sink plates comprises a tab extending from a corresponding one of said side wall structures into the positioning notch.

4. The memory module assembly of claim 1,
   wherein the first heat-sink plate comprises said tab, and
   wherein the side wall structure of said second heat-sink plate comprises a groove formed such that an end of the tab is received in said groove when both the first and second heat-sink plates are mounted on the substrate.

5. The memory module assembly of claim 1, wherein both the first and second heat-sink plates comprise corresponding tab portions extending partially into the notch.

6. The memory module assembly of claim 1, wherein said means for pressing comprises at least one clip including a first engaging portion connected to the first outer surface of the first heat-sink plate, a second engaging portion connected to the second outer surface of the second heat-sink plate, and a linking member connected between the first and second engaging members.

7. The memory module assembly of claim 6, wherein the first heat-sink plate comprises first means for engaging the first engaging portion of the clip, and wherein the second heat-sink plate comprises second means for engaging the second engaging portion of the clip.

8. The memory module assembly of claim 7, wherein the first and second engaging means comprise hooks protruding from said first and second outer surfaces, respectively.

9. The memory module assembly of claim 7,
   wherein the first engaging means comprises slots for receiving protruding end structures of said first engaging portion, and
   wherein the second engaging means comprises a hole for receiving a positioning pin of said second engaging portion.

10. The memory module assembly of claim 6, wherein said means comprises:
   a first single-piece clip connected between the first upper surface region and the second outer surface; and
   a second single-piece clip connected between the second upper surface region and the second outer surface.

11. The memory module assembly of claim 1, wherein each of said first and second adhesive portions comprise a heat-activated adhesive material exhibiting a first, relatively low adherence when heated to a first, relatively high temperature, and exhibiting a second, relatively high adherence when subsequently cooled to a second, relatively low temperature.

12. The memory module assembly according to claim 1, wherein each of the first and second adhesive portions comprises one of a high thermal conductive adhesive film and a thermal-bond adhesive film.

13. The memory module assembly of claim 1, further comprising a thermal paste disposed between the upper surface of the AMB device and the third planar underside surface.

14. A memory module assembly comprising:
a memory module printed circuit board assembly (PCBA) including:
- a substrate having opposing first and second surfaces, a plurality of first wiring traces formed on at least one of the first and second surfaces, each of the first wiring traces being connected to an associated metal contact pad formed along a connector edge of the substrate, the substrate also having opposing first and second side edges disposed at opposing ends of the connector edge, wherein each of said first and second side edges defines a notch; and
- a first plurality of first integrated circuit (IC) devices and a second plurality of said first IC devices disposed on the first surface of the substrate such that upper surfaces of the first and second pluralities of first IC devices define a first plane that is parallel to the first surface of the substrate, and
- a second IC device disposed on the first surface between the first and second pluralities of first devices, the second IC device having an upper surface defining a second plane that is parallel to the first surface of the substrate, wherein the first plane is located between the second plane and the first surface of the substrate;

a first heat-sink plate including:
- a first recessed region having a first planar upper surface and an opposing first planar underside surface, the first recessed region having a first side wall structure contacting the first surface of the substrate adjacent to a first side edge, and a tab extending into the notch defined by the first side edge;
- a second recessed region having a second planar upper surface and an opposing second planar underside surface, the second recessed region having a first side wall structure contacting the first surface of the substrate adjacent to a second side edge, and a tab extending into the notch defined by the second side edge;
- a raised pocket region defining a third planar upper surface and an opposing third planar underside surface, the pocket region being disposed between the first and second recessed regions; and
an adhesive portion disposed between at least one of the first and second planar underside surfaces of said first heat sink plate and the upper surface of at least one of said first and second pluralities of said first IC devices.

15. The memory module assembly according to claim 14, wherein the memory module further comprises a plurality of third IC devices mounted on the second surface of the substrate such that an upper surface of each of the plurality of third IC devices defines a third plane that is parallel to the second surface,
wherein the memory module assembly further comprises a second heat-sink plate having a fourth planar outer surface and a fourth planar underside surface, and a second adhesive portion sandwiched between the fourth planar underside surface and the upper surface of at least one of the plurality of third IC devices, and
wherein said clip includes a first engaging portion connected to at least one of the first planar upper surface, the second planar upper surface, and the raised pocket region, the clip also including a second engaging portion connected to the fourth planar outer surface of the second heat-sink plate.

16. The memory module assembly according to claim 14, wherein said adhesive portions comprise at least one of a heat-activated adhesive material, a high thermal conductive adhesive film, a thermal-bond adhesive film, and a thermal paste.

* * * * *